United States Patent
Tsumori et al.

(10) Patent No.: US 10,450,505 B2
(45) Date of Patent: Oct. 22, 2019

(54) WAVELENGTH CONVERSION MEMBER AND LIGHT-EMITTING DEVICE

(71) Applicant: SHIN-ETSU CHEMICAL CO., LTD., Tokyo (JP)

(72) Inventors: Toshihiro Tsumori, Echizen (JP); Hajime Nakano, Echizen (JP); Toshihiko Tsukatani, Echizen (JP); Kazuhiro Wataya, Echizen (JP); Takehisa Minowa, Echizen (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 345 days.

(21) Appl. No.: 15/534,365

(22) PCT Filed: Nov. 27, 2015

(86) PCT No.: PCT/JP2015/083313
§ 371 (c)(1),
(2) Date: Jun. 8, 2017

(87) PCT Pub. No.: WO2016/093076
PCT Pub. Date: Jun. 16, 2016

(65) Prior Publication Data
US 2017/0342320 A1 Nov. 30, 2017

(30) Foreign Application Priority Data

Dec. 9, 2014 (JP) .................. 2014-248972

(51) Int. Cl.
*C09K 11/77* (2006.01)
*C09K 11/02* (2006.01)
(Continued)

(52) U.S. Cl.
CPC .......... *C09K 11/7721* (2013.01); *C09K 11/02* (2013.01); *C09K 11/616* (2013.01);
(Continued)

(58) Field of Classification Search
CPC . H01L 33/504; H01L 33/501; C09K 11/7774; C09K 11/02; C09K 11/616
See application file for complete search history.

(56) References Cited

U.S. PATENT DOCUMENTS 8,974,696 B2   3/2015  Kaneyoshi et al.
9,564,557 B2 * 2/2017  Weiler .................. H01L 33/504
9,988,572 B2 * 6/2018  Wataya ................ C09K 11/616

FOREIGN PATENT DOCUMENTS

JP   2012-224536 A   11/2012
JP   2013-102078 A    5/2013
(Continued)

OTHER PUBLICATIONS

International Search Report for PCT/JP2015/083313 (PCT/ISA/210) dated Feb. 16, 2016.

*Primary Examiner* — C Melissa Koslow
(74) *Attorney, Agent, or Firm* — Birch, Stewart, Kolasch & Birch, LLP (57) ABSTRACT

Provided is a wavelength conversion member in which the following are dispersed in a thermoplastic resin: a LuYAG fluorescent material that is represented by $(Y_{1-\alpha-\beta}Lu_\alpha Ce_\beta)_3 Al_5 O_{12}$ (in which α is a positive number between 0.3-0.8 inclusive and β is a positive number between 0.01-0.05 inclusive), that emits yellow-green light as a result of excitation by blue light, and that has a diffraction peak within a range in which the diffraction angle 2θ in X-ray diffraction by the $K_{\alpha 1}$ line of Cu is 52.9° to 53.2° inclusive; and a KSF fluorescent material that is represented by $K_2(Si_{1-x} Mn_x)F_6$ (in which x is a positive number between 0.001 and 0.3 inclusive) and that emits red light as a result of excitation by blue light. The content of the KSF fluorescent material in the wavelength conversion member is 1 to 5 times the content of the LuYAG fluorescent material by mass ratio. The wavelength conversion member makes it possible to (Continued)

provide a light-emitting device that has small color deviation, that is suitable as a lighting device, that emits white light, and that has good color rendering properties in a color temperature range of 4,000-6,500K, i.e., the color temperature range from white to daylight color.

6 Claims, 6 Drawing Sheets

(51) Int. Cl.
    *C09K 11/61* (2006.01)
    *H01L 33/50* (2010.01)

(52) U.S. Cl.
    CPC ........ *C09K 11/7774* (2013.01); *H01L 33/502* (2013.01); *H01L 33/504* (2013.01); *H01L 33/501* (2013.01); *Y02B 20/181* (2013.01)

(56) References Cited

FOREIGN PATENT DOCUMENTS

| | | |
|---|---|---|
| JP | 2013-171844 A | 9/2013 |
| WO | WO 2013/121355 A1 | 8/2013 |

* cited by examiner

COLOR TEMPERATURES OF EXAMPLES 1 TO 6

WAVELENGTH CONVERSION MEMBER AND LIGHT-EMITTING DEVICE

TECHNICAL FIELD

This invention relates to a wavelength conversion member for significantly improving the color rendering of light-emitting devices using blue light-emitting diodes (LEDs), for use in general purpose illuminating devices, backlight sources and headlight sources, as compared with the prior art, and a light-emitting device comprising the wavelength conversion member.

BACKGROUND ART

Light-emitting diodes (LEDs) belong to a class of the most efficient illumination light sources among currently available light sources. In particular, white LEDs find a rapidly expanding share in the market as the next-generation light source to replace incandescent lamps, fluorescent lamps, cold cathode fluorescent lamps (CCFL) for backlight, and halogen lamps. A white LED structure for use in light-emitting devices for illumination is constructed by combining a blue light-emitting diode (blue LED) with a phosphor capable of emitting light of longer wavelength, for example, yellow or green light upon blue light excitation, which technology is widely implemented on a commercial basis.

The mainstream of the white LED structure is a system in which a phosphor-mixed resin or glass is coated on an upper surface of a blue LED chip to encapsulate the LED chip so that the phosphor may convert the wavelength of part or all of blue light from the blue LED chip for producing pseudo-white light, i.e., integrated LED chip/phosphor system. There is also known a white LED structure based on another system in which a wavelength conversion member made of a phosphor-mixed resin or glass is separate from the encapsulant of a blue LED chip and disposed forward in the emission direction of the LED chip, so that the phosphor may convert the wavelength of part or all of blue light. The latter system is modified into an advanced system in which the phosphor-containing wavelength conversion member is spaced apart from a LED chip by a distance of several millimeters to several centimeters, for thereby achieving an improvement in emission efficiency and a suppression of color shift even when the LED chip is of high power so that properties of the phosphor are liable to degrade by the heat generated from the light-emitting portion. This system wherein the wavelength conversion member is spaced apart from the LED chip is known as "remote phosphor system," on which active efforts are currently focused. In addition to the above advantages, the remote phosphor system has advantages as practical lighting fixtures including an improvement in overall color variation and a minimal variation during mass production.

The light-emitting device of the remote phosphor system has the structure wherein a wavelength conversion member, which is formed by dispersing yellow light-emitting phosphor particles, green light-emitting phosphor particles and optionally red light-emitting phosphor particles in a resin or glass, or by coating such phosphors to the surface of a transparent substrate, is disposed forward of a LED light source. Typical phosphors used in the wavelength conversion member of the remote phosphor system include $Y_3Al_5O_{12}:Ce^{3+}$ or cerium-activated yttrium-aluminum garnet phosphor represented by $Y_3Al_5O_{12}:Ce^{3+}$ (YAG phosphor), and $Lu_3Al_5O_{12}:Ce^{3+}$ or cerium-activated lutetium-aluminum garnet phosphor represented by $Lu_3Al_5O_{12}:Ce^{3+}$ (LuAG phosphor). Other phosphors include $(Y,Gd)Al_5O_{12}:Ce^{3+}$, $TbAl_5O_{12}:Ce^{3+}$, $(Sr,Ca,Ba)_2SiO_4:Eu^{2+}$, and $\beta$-SiON:$Eu^{2+}$. In some cases, phosphors such as $CaSiN_3:Eu^{2+}$ and $Sr—CaSiN_3:Eu^{2+}$ are used in combination with the foregoing phosphors for the purpose of improving color rendering.

Recently, for the light-emitting device using white LED, especially the lighting fixture using white LED, the color rendering of its light emission is considered important. In the illumination field which assumes that sunlight is ideal light or reference, light capable of representing a color close thereto is regarded as light having excellent color representation, i.e., color rendering. As the system for the numerical evaluation of color rendering, the system defined by Commission Internationale de l'Eclairage (CIE) in 1931 is widely used. In this system, differences in color rendition of eight color chips, numbered R1 to R8, are quantified on a scale of −100 to 100 and averaged to give an average color rendering index Ra. Also, in JIS Z 8726:1990 which expands the color rendering evaluation of the CIE system by adding seven color chips, numbered R9 to R15, to the eight color chips, the color rendering evaluation method using fifteen color chips is defined.

When the emission of white LED is evaluated by the above color rendering evaluation method, most prior art light-emitting devices have an average color rendering index Ra which is not regarded better than the existing illuminations such as conventional incandescent lamps and fluorescent lamps. They tend to have low values of the special color rendering index R9 using red color chip R9 among others.

Figure 10:
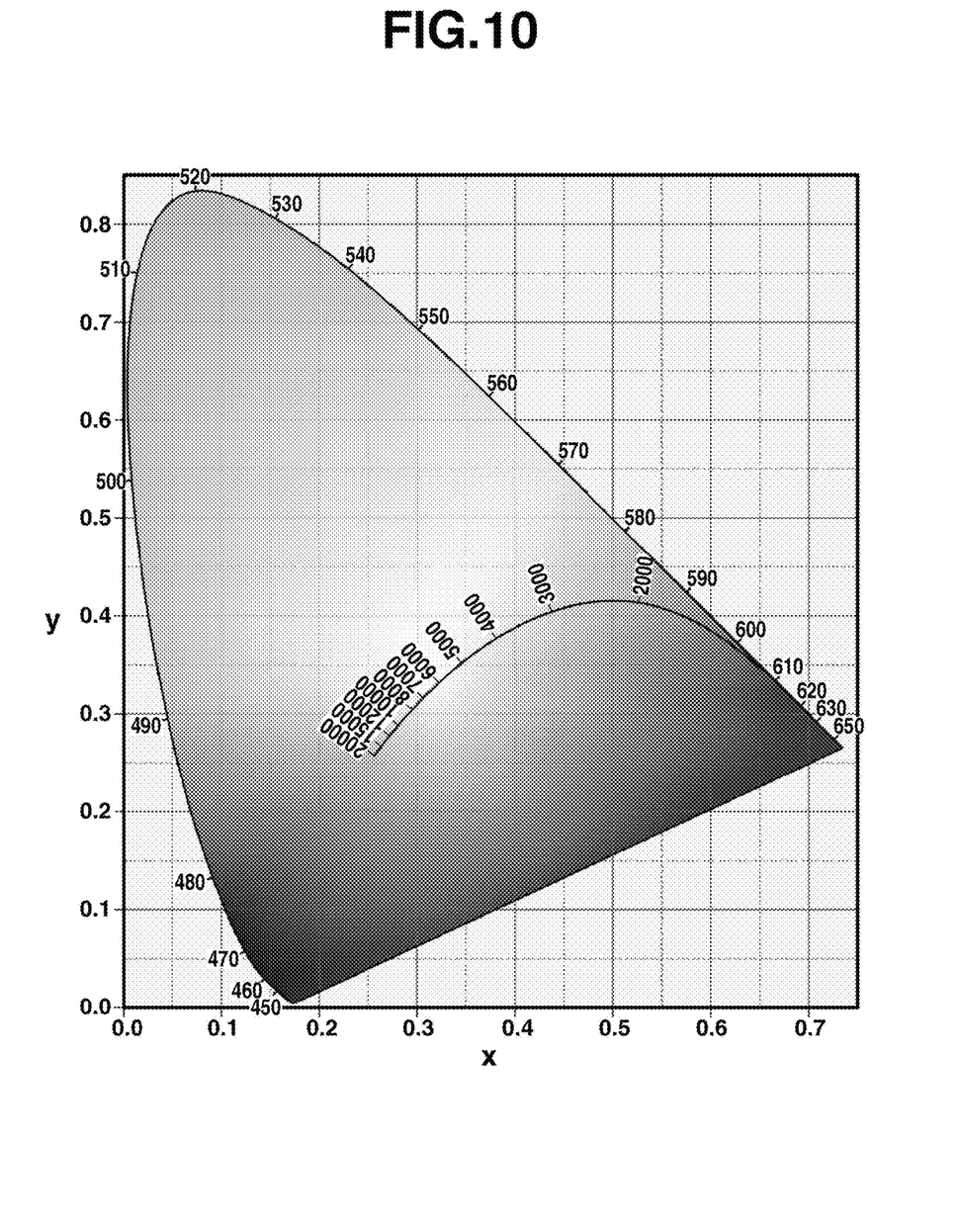
FIG. 10 is a diagram showing the blackbody radiation locus on the xy chromaticity diagram (CIE 1931).

The evaluation of color deviation of light is also important as the color rendering index of illuminating light. Natural light (sunlight) serving as the reference of emission color changes its tint from bluish white light to reddish light depending on the altitude of the sun, which is completely the same as the relationship of temperature and emission color of a red-hot object. Its chromaticity is drawn as a blackbody radiation locus on the xy chromaticity diagram (CIE 1931) as shown in FIG. 10.

The emission color of LED is not limited within the range of the blackbody radiation locus because its emission principle differs from thermal radiation like natural light. However, the light emission of LED whose chromaticity coordinates are spaced apart from the blackbody radiation locus gives an unnatural impression because the quality of light is perceived green or reddish purple even though the color reproduction of an object which is illuminated is satisfactory. Therefore, white LED is generally adjusted in emission color such that the chromaticity coordinates of emission lie on the blackbody radiation locus. That is, the LED light-emitting device for the illumination application is regarded excellent in color rendering when the color rendering index as an index of color reproduction (or color rendering), especially average color rendering index Ra, determined from color rendering indices R1 to R8, and special color rendering index R9 are high and the chromaticity coordinates of emission lie on the blackbody radiation locus.

A shift of the emission color of an LED light-emitting device from the blackbody radiation locus is known as color deviation and may be quantified as a deviation duv ($\Delta$uv) between illuminating light and the blackbody radiation locus in the (u,v) chromaticity diagram (CIE 1960). The (u,v) chromaticity diagram is used in determining a color deviation because the (u,v) chromaticity diagram is set such that a distance from an arbitrary point is equal to a perceivable color difference, and it is convenient for quantifying the color deviation. Among LED light-emitting devices, those having as small an absolute value of duv as possible are better, with those having an absolute value of duv equal to or less than 0.001 being preferred.

Furthermore, with respect to the color temperature (CCT) of illuminating light, light emission having a high color temperature, for example, of 6000K gives a high contrast cold impression. On the other hand, it is known that light having a low color temperature, for example, of 3000K gives a warm comfortable feeling. On use of a lighting fixture, an illumination having a color temperature complying with the environment is chosen.

PRIOR ART DOCUMENTS

Patent Documents

Patent Document 1: JP-A 2012-224536

SUMMARY OF THE INVENTION

Problems to be Solved by the Invention

The inventors previously developed a LED light-emitting device of the remote phosphor system having a high value of special color rendering index Ra, by using a phosphor mixture of manganese-activated complex fluoride phosphor represented by $K_2SiF_6:Mn^{4+}$ (or KSF phosphor) and YAG phosphor. The LED light-emitting device using this phosphor mixture in a wavelength conversion member emits light with a favorable color having an Ra value in excess of 90 and good reproduction of red as compared with conventional white LEDs. However, the color temperature region corresponding to the highest value of Ra is relatively as low as 4000K or less. An attempt to gain luminous emission having an Ra value in excess of 90 in the color temperature region of at least 4000K results in a color deviation duv being biased in somewhat negative direction and light being slightly tinted reddish purple. With respect to the combination of KSF phosphor with YAG phosphor, although good color reproduction is available when the color temperature is low, the color rendering of emission color is not sufficient when the color reproduction over a wide color temperature region and the color deviation duv in a general color temperature region from white to daylight color (e.g., 4000 to 6500K) are taken into account.

The inventors also developed a LED light-emitting device using a phosphor mixture of KSF phosphor and LuAG phosphor as the phosphor in a wavelength conversion member. Although light emission having an Ra value in excess of 90 in the color temperature region in excess of 6500K and excellent reproduction of red is obtained, the color reproduction in a low color temperature region is poor in this case. The combination of KSF phosphor and LuAG phosphor provides good color reproduction when the color temperature is high, but is yet insufficient in color rendering of emission color like the previous device using the phosphor mixture of KSF phosphor and YAG phosphor.

As the method for improving both values of Ra and duv in the color temperature region from white to daylight, it is contemplated to mix KSF phosphor with LuAG phosphor along with YAG phosphor to broaden the color temperature range. However, when YAG phosphor and LuAG phosphor having similar fluorescent properties are used in admixture, it is difficult to obtain an LED illumination with satisfactory color rendering because mutual absorption of emissions occurs between the phosphors.

An object of the invention, which has been made under the above-mentioned circumstances, is to provide a wavelength conversion member which targets a color temperature region of 4000 to 6500K corresponding to the general color temperature region of white to daylight color, especially a color temperature region of around 5000K, and when combined with blue LED, produces luminous emission having satisfactory color rendering and minimal color deviation duv) in the target color temperature region, and a light-emitting device comprising the wavelength conversion member.

Means for Solving the Problems

Regarding an LED light-emitting device for producing white light using blue LED, the inventors made a study on a yellow phosphor to be combined with manganese-activated complex fluoride phosphor (KSF phosphor) in order to obtain luminous emission having satisfactory color rendering and minimal color deviation in the color temperature region of around 5000K. The inventors have found that satisfactory luminous emission is obtained by combining the KSF phosphor with a cerium-activated lutetium-yttrium-aluminum garnet phosphor (LuYAG phosphor).

The LuYAG phosphor is generally a complex oxide phosphor represented by $(Y,Lu)_3Al_5O_{12}:Ce^{3+}$, and corresponds to a commonly known yttrium-aluminum garnet oxide in which the yttrium site in its crystal is replaced by lutetium and which is activated with cerium to become a phosphor. This phosphor may be adjusted in emission color of fluorescence by adjusting the amount of replacing lutetium and the amount of activating cerium. This phosphor, when excited with blue light of wavelength 420 to 490 nm, emits fluorescence of yellowish green having a broad emission spectrum with a main wavelength of 563 to 570 nm, which is adequate for combination with the KSF phosphor.

Making further investigations to solve the outstanding problem, the inventors have found that by using specific LuYAG phosphor along with KSF phosphor, dispersing the phosphors in a thermoplastic resin, forming a wavelength conversion member therefrom, placing it on the optical axis of an LED light source capable of emitting light containing a blue component, especially at a position spaced from the LED light source according to the remote phosphor system, there is obtained a light-emitting device for emitting light having improved color rendering and a minimal color deviation duv in the color temperature region of around 5000K, especially a light-emitting device for emitting light having improved color in the color temperature region of 4000 to 6500K which is important for lighting devices for producing white light.

Accordingly, the invention provides a wavelength conversion member and a lighting device as defined below.

[1] A wavelength conversion member comprising a phosphor dispersed in a thermoplastic resin, the phosphor comprising (A) a cerium-activated lutetium-yttrium-aluminum garnet phosphor represented by the compositional formula (1):

$$(Y_{1-\alpha-\beta}Lu_\alpha Ce_\beta)_3Al_5O_{12} \qquad (1)$$

wherein α is a positive number of from 0.3 to 0.8 and β is a positive number of from 0.01 to 0.05, capable of emitting yellow-green light upon excitation with blue light, and having a diffraction peak within a diffraction angle 2θ range of from 52.9° to 53.2° in X-ray diffraction by the $K_{\alpha 1}$ line of Cu, and (B) a manganese-activated silicon complex fluoride phosphor represented by the compositional formula (2):

$$K_2(Si_{1-x}Mn_x)F_6 \quad (2)$$

wherein x is a positive number of from 0.001 to 0.3, and capable of emitting red light upon excitation with blue light, in a weight ratio of the phosphor as component (B) to the phosphor as component (A) of from 1/1 to 5/1.

[2] The wavelength conversion member of [1] wherein the phosphor as component (A) has an outer appearance color having an a* value of from −23.0 to −21.0 and a b* value of from 87.0 to 97 as chromaticity coordinates in the CIE L*a*b* colorimetric system.

[3] The wavelength conversion member of [1] or [2] wherein the thermoplastic resin comprises at least one resin selected from the group consisting of a polyolefin, polystyrene, styrene copolymer, fluoro-resin, acrylic resin, nylon, polyester, polyethylene terephthalate, polycarbonate, vinyl chloride resin and polyether resin.

[4] A light-emitting device comprising a blue LED light source capable of emitting light containing a blue light component having a peak wavelength of 440 to 470 nm and having an optical axis and a wavelength conversion member disposed on the optical axis of the blue LED light source, the wavelength conversion member being of any one of [1] to [3].

[5] The light-emitting device of [4] which emits light of color having an x value of from 0.3100 to 0.3850 and a y value of from 0.3190 to 0.3790 as chromaticity coordinates in the xy chromaticity diagram (CIE 1931).

[6] The light-emitting device of [4] or [5] which is of remote phosphor type.

Advantageous Effects of the Invention

The light-emitting device of the invention produces light having improved color rendering and a minimal color deviation duv in the color temperature region of 4000 to 6500K which is the color temperature region of white to daylight color, i.e., white light suitable as a lighting device.

BRIEF DESCRIPTION OF DRAWINGS

FIG. 5 schematically illustrates the emission modes of LED light-emitting devices, FIG. 5(A) being the emission mode of a light-emitting device of remote phosphor type, and FIG. 5(B) being the emission mode of a prior art light-emitting device of multiple white LED type.

EMBODIMENT FOR CARRYING OUT THE INVENTION

Now the invention is described in detail.

First the wavelength conversion member of the invention is described.

The wavelength conversion member of the invention includes a thermoplastic resin and a phosphor, and is a resin molding having the phosphor dispersed in the thermoplastic resin. The phosphor used herein is preferably in particle or powder form.

The resin serving as a matrix in which the phosphor is incorporated is a thermoplastic resin having a short solidification time during molding. Thermosetting resins entailing reaction curing, typically silicone resins take several tens of minutes to several hours until they are cured from the fluidity state, allowing phosphor particles settle down or agglomerate together before the completion of curing. It is thus difficult to disperse plural types of phosphors in the resin simultaneously and uniformly. Also, once the thermosetting resin is cured, the content of phosphor cannot be re-adjusted. Namely, the phosphor content is fixed at the initial setting and can be changed no longer. Further, the thermoplastic resin allows plural types of phosphors to be mixed in order or to be individually mixed with the resin and thereafter combined together, whereas any of these mixing procedures cannot be employed for the thermosetting resin. Therefore, the thermoplastic resin is more adequate in the practice of the invention using two or more types of phosphors with different emission colors.

Among thermoplastic resins, those having improved optical properties, chemical resistance to alkali, and moisture proofness of a mixture of the resin and the phosphor are preferred. From these standpoints, the thermoplastic resin used in the wavelength conversion member of the invention is preferably selected from among polyolefins such as polyethylene and polypropylene, polystyrenes such as general-purpose polystyrene (GPPS), styrene copolymers such as styrene-maleic acid copolymers, styrene-methyl methacrylate copolymers, acrylonitrile-butadiene-styrene copolymers (ABS), fluoro-resins, acrylic resins, nylons (polyamide resins), polyesters, polyethylene terephthalate, polycarbonate, vinyl chloride resins and polyether resins. In the practice of the invention, the resin in which the phosphor is mixed is one or more resins selected from the foregoing thermoplastic resins. Inter alia, polyolefins, polystyrenes, styrene copolymers and acrylic resins are preferred. In particular, polypropylene and acrylic resins are most preferred because the phosphor can be mixed over a wide content range, and the resin and phosphor are minimized in decomposition and degradation.

The thermoplastic resin used herein is preferably an amorphous transparent resin because of optical application while it need not have a high linear transmittance as long as the attenuation of the total of transmitted light is fully low. As to working properties of resin, preference is given to an injection moldable resin having a melt flow rate (MFR) of about 5 to 30 g/10 min as measured according to JIS K 7210.

The phosphor in the wavelength conversion member of the invention contains two types of phosphors as essential components, (A) a cerium-activated lutetium-yttrium-aluminum garnet phosphor (LuYAG phosphor) and (B) a manganese-activated silicon complex fluoride phosphor (KSF phosphor).

Component (A) is a cerium-activated lutetium-yttrium-aluminum garnet phosphor (LuYAG phosphor) represented by the compositional formula (1):

$$(Y_{1-\alpha-\beta}Lu_\alpha Ce_\beta)_3Al_5O_{12} \quad (1)$$

wherein α is a positive number of from 0.3 to 0.8 and β is a positive number of from 0.01 to 0.05, and capable of emitting yellow-green light upon excitation with blue light. The phosphor has a structure in which some sites of constituent Lu or Y or both are replaced by trivalent cerium ($Ce^{3+}$). Thus the LuYAG phosphor is also expressed as $(Y,Lu)_3Al_5O_{12}$:Ce or $(Y,Lu)_3Al_5O_{12}$:$Ce^{3+}$. The LuYAG phosphor emits yellow-green light having a broad spectrum spanning a main wavelength of 563 to 570 nm, when excited with blue light having wavelength 420 to 490 nm, preferably wavelength 440 to 470 nm.

As used herein, the main wavelength is a dominant wavelength, i.e., a wavelength at which emission is perceivable at the highest intensity, and is represented as a wavelength at the position of an intersection in the xy chromaticity diagram (CIE 1931), the intersection being obtained by drawing a straight line between the chromaticity coordinates of emission and the white point (x=0.3333, y=0.3333), and extending the straight line for intersecting the extension with the outer periphery of a color representation region in the chromaticity diagram, as prescribed in Annex of JIS Z 8701.

Since the peak wavelength of fluorescence changes as the value of α in compositional formula (1), that is, the ratio of Lu to Y is changed, the value of α is in a range from 0.3 to 0.8 in the invention. The value of β representative of the proportion of activator Ce is in a range from 0.01 to 0.05. If β is less than 0.01, LuYAG phosphor has a low emission efficiency. If β is more than 0.05, phosphor particles are fused together by the heat applied during preparation of LuYAG phosphor and become difficult to be mixed in the thermoplastic resin. The values of α and β are preferably selected such that α is approximately in a range of 0.4 to 0.6 when β is equal to 0.02, for example.

The LuYAG phosphor as component (A) should preferably have a diffraction peak within a diffraction angle 2θ range of from 52.9° to 53.2° in X-ray diffraction by the $K_{\alpha1}$ line of Cu (characteristic X-ray at wavelength ~4.54060 Å). The LuYAG phosphor having a diffraction peak within this angle range has a garnet crystal structure like the YAG and LuAG phosphors, and is characterized by an interplanar spacing on (444) plane ranging from 1.720 Å to 1.728 Å.

Also the LuYAG phosphor as component (A) should preferably have an outer appearance color having an a* value of from −23.0 to −21.0 and a b* value of from 87.0 to 97 in the chromaticity coordinates of the CIE L*a*b* colorimetric system. Herein the value of lightness L* is preferably in a range of 0.104 to 0.107 in the CIE L*a*b* colorimetric system, but not limited thereto.

The LuYAG phosphor having a diffraction peak and an outer appearance color as defined above is used in combination with the KSF phosphor as component (B) to be described later to construct the wavelength conversion member, which is, in turn, used along with a blue LED capable of emitting blue light of the predetermined wavelength, to construct a light-emitting device which emits light having a satisfactory color rendering and a minimal color deviation duv in the color temperature region of 4000 to 6500K corresponding to the color temperature region of white to daylight color, especially the color temperature region of around 5000K (e.g., 4500 to 5500K).

Figure 1:
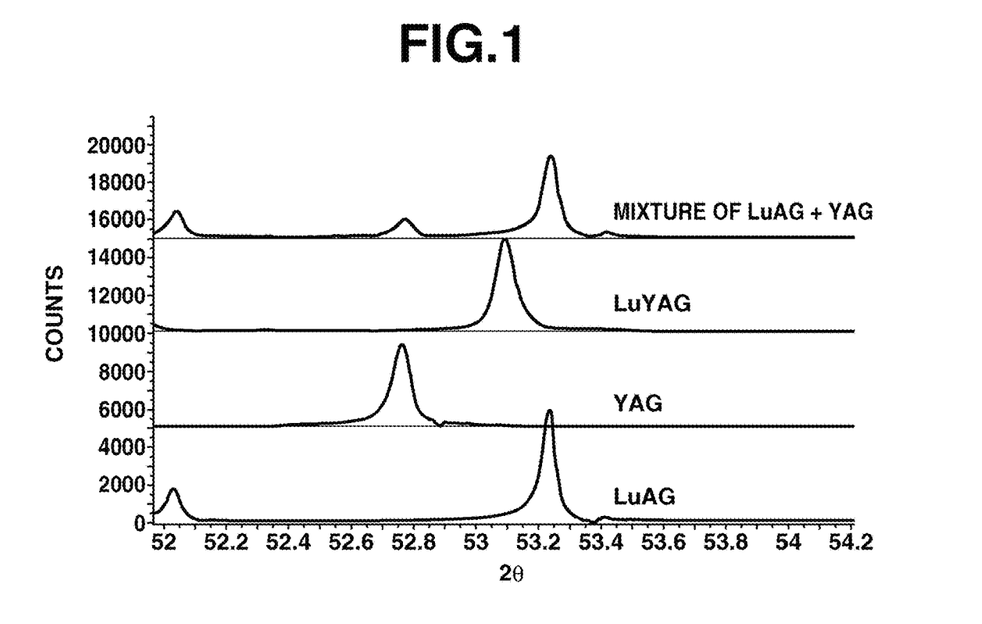
FIG. 1 is a diagram showing X-ray diffraction profiles of LuYAG phosphor, YAG phosphor, LuAG phosphor, and a phosphor mixture of YAG phosphor and LuAG phosphor.

FIG. 1 is a diagram showing the X-ray diffraction profile of LuYAG phosphor using the $K_{\alpha1}$ line of Cu. A comparison with the X-ray diffraction profiles of YAG phosphor, LuAG phosphor, and a phosphor mixture of YAG phosphor and LuAG phosphor shown in the same diagram reveals that the LuYAG phosphor according to the invention exhibits a specific diffraction peak in the range from 52.9° to 53.2° in stark contrast thereto.

Figure 2:
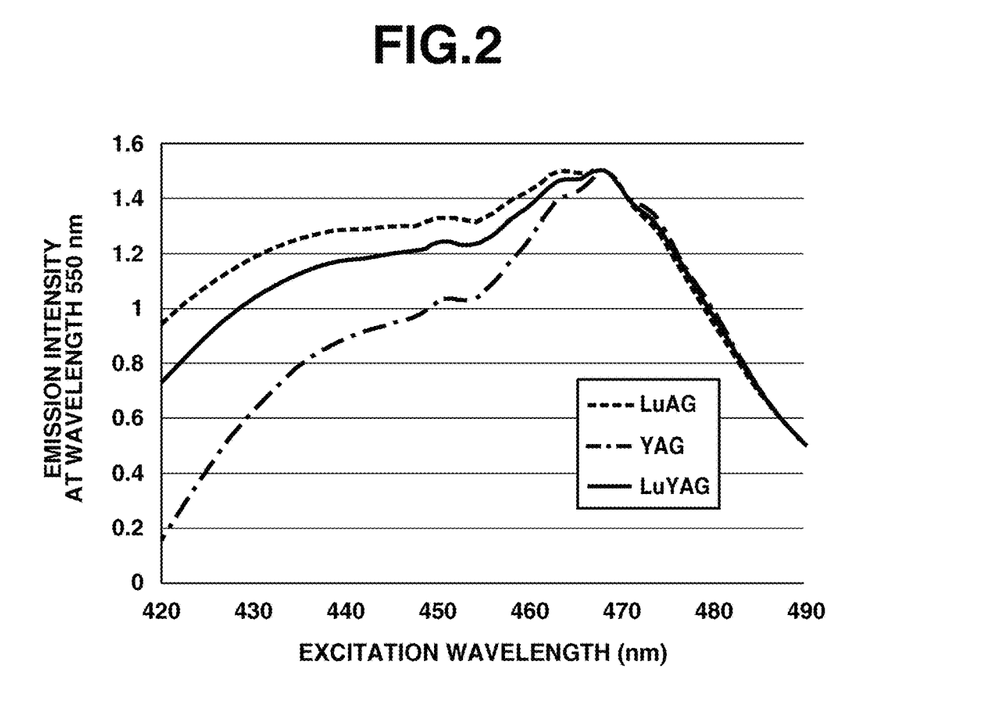
FIG. 2 is a diagram showing the intensity of wavelength 550 nm emission (fluorescence) of LuYAG phosphor, YAG phosphor, and LuAG phosphor, in response to excitation light of wavelength 420 to 490 nm.

Also FIG. 2 is a diagram showing the intensity of wavelength 550 nm emission (fluorescence) of LuYAG phosphor, YAG phosphor, and LuAG phosphor, when excited with light of wavelength 420 to 490 nm. As seen from FIG. 2, the percent utilization of excitation light at every wavelength of the LuYAG phosphor differs from those of YAG and LuAG phosphors.

Figure 3:
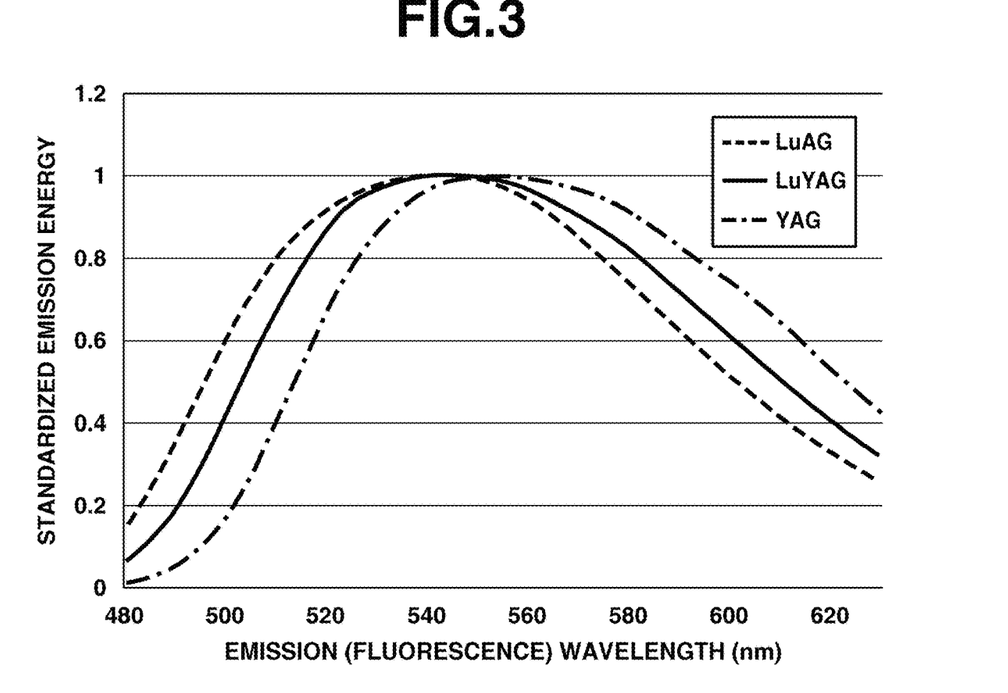
FIG. 3 illustrates the spectra of emission (fluorescence) of LuYAG phosphor, YAG phosphor, and LuAG phosphor, when excited with blue light of wavelength 450 nm which is the common main wavelength of blue LED.

Further FIG. 3 is a diagram showing the spectra of emission (fluorescence) of LuYAG phosphor, YAG phosphor, and LuAG phosphor, when excited with blue light of wavelength 450 nm which is the general main wavelength of blue LED. As seen from FIG. 3, the emission spectral pattern of LuYAG phosphor upon excitation at the main wavelength of blue LED differs from either of YAG and LuAG phosphors.

As discussed above, the excitation properties and fluorescent properties of the inventive LuYAG phosphor are different from those of YAG and LuAG phosphors. The above-mentioned characteristic excitation properties and fluorescent properties of the inventive LuYAG phosphor having the above-specified X-ray diffraction peak (crystal structure) and outer appearance color ensure satisfactory color rendering and color deviation duv when combined with the KSF phosphor as component (B).

The LuYAG phosphor used herein may be prepared by the plasma melting method. In the plasma melting method, previously granulated source particles are passed through a high-temperature plasma flame so that they are instantaneously melted and solidified, thereby forming amorphous particles having constituent elements uniformly mixed therein, without constraint by the solid-solution limit of elements.

The LuYAG phosphor suited for use herein may be prepared, for example, by the following method. The method involves the steps of furnishing a slurry of a fine powder of alumina ($Al_2O_3$) and a fine powder of oxides of other elements, i.e., yttrium, lutetium and cerium, for example, yttrium-lutetium-cerium co-precipitated oxide, granulating the slurry into particles having an average particle size of 5 to 65 μm, and passing the particles through an argon plasma containing hydrogen gas, typically 1 to 10 mol % of hydrogen gas for melting, partial reduction and solidification. The amorphous particles thus obtained are heat treated in a stream of inert gas (e.g., argon gas) containing hydrogen gas, typically 0.5 to 3 mol % of hydrogen gas at a temperature of 1,200 to 1,600° C. for 3 to 6 hours, and then cooled, with an average cooling rate of at least 5° C./min being selected in a temperature range down to 1,000° C. In this way, crystallized phosphor particles are obtained.

The reason why LuYAG phosphor suited for the invention is obtained by the above method is estimated to reside in that by controlling the solidification rate of molten particles (droplets) after plasma melting, and the holding temperature, holding time and cooling rate of the later stage heat treatment, the particles are crystallized as phosphor while maintaining satisfactory dispersion of Y and Lu in phosphor particles, although the reason is not limited thereto. In contrast, the prior art method for mixing and firing oxide raw materials having flux added thereto has a likelihood that the activator cerium serving as the luminescent center is expelled out of the phosphor crystal lattice and the distribution of Lu and Y become uneven. Thus, this mixing/firing method is inadequate for the preparation of LuYAG phosphor.

The LuYAG phosphor preferably has a particle size of at least 1 μm, especially at least 5 μm, and up to 100 μm, especially up to 50 μm, as a volume cumulative particle diameter D50 in particle size distribution. If the D50 value is less than 1 μm, the phosphor may experience a sharp drop of emissive performance. Inversely, if phosphor particles of a larger size are mixed in the thermoplastic resin, there is a possibility that the spacing between phosphor particles in the thermoplastic resin is greater than that between particles of a smaller size mixed in the resin in the same content whereby the percent absorption/utilization of blue light as excitation light is lowered.

It is noted that as the particle size used herein, a value obtained by the dry laser diffraction scattering method involving the steps of irradiating laser light to a test powder sprayed or dispersed in air in a floating state, and computing a particle size from the resulting diffraction pattern is applicable. The dry laser diffraction scattering method is preferable in that the measurement is not affected by humidity and the particle size distribution can be evaluated at the same time.

Component (B) is a manganese-activated silicon complex fluoride phosphor (KSF phosphor) represented by the compositional formula (2):

$$K_2(Si_{1-x}Mn_x)F_6 \tag{2}$$

wherein x is a positive number of from 0.001 to 0.3, preferably up to 0.1, and capable of emitting red light upon excitation with blue light. The phosphor has a structure in which some sites of constituent Si are replaced by tetravalent manganese ($Mn^{4+}$). Thus the KSF phosphor is also expressed as $K_2SiF_6$:Mn or $K_2SiF_6$:$Mn^{4+}$. The KSF phosphor emits red light having the maximum emission peak in a wavelength range of 630 to 640 nm, when excited with blue light having wavelength 420 to 490 nm, preferably wavelength 440 to 470 nm.

The KSF phosphor may be any of products prepared by the prior art well-known methods, for example, by dissolving or dispersing metal fluoride raw materials such as silicon fluoride and manganese fluoride in hydrofluoric acid, and heating the solution or dispersion for evaporating to dryness.

The KSF phosphor preferably has a particle size of at least 2 μm, especially at least 10 μm, and up to 200 μm, especially up to 60 μm, as a volume cumulative particle diameter D50 in particle size distribution. If the D50 value is less than 2 μm, the phosphor may experience a drop of emission efficiency. Inversely, if phosphor particles are of a larger size, there is a strong likelihood for the drawback that the distribution of phosphor particles mixed in the thermoplastic resin is uneven, despite no essential problems as to emission. Thus phosphor particles with a D50 of up to 200 μm are preferred.

In the phosphor used in the wavelength conversion member, the proportion of LuYAG phosphor as component (A) and KSF phosphor as component (B) is set, depending on the desired color temperature of emission and the wavelength of blue LED light source, such that a ratio of LuYAG phosphor as component (A) to KSF phosphor as component (B) ranges from 1/1 to 5/1 (weight ratio). Particularly when the light source is a blue LED having a peak wavelength of around 450 nm (e.g., 440 to 470 nm), the ratio of LuYAG phosphor as component (A) to KSF phosphor as component (B) is set in the range from 2/1 to 4/1 (weight ratio). Then there is obtained light of natural color having a minimal deviation duv from the blackbody radiation locus in the (u,v) chromaticity diagram (CIE 1960) and adjoining the blackbody radiation locus.

According to the invention, the phosphor may contain an auxiliary phosphor other than the LuYAG and KSF phosphors as components (A) and (B) in an amount of up to 20% by weight based on the total weight of phosphors, if necessary. The content of auxiliary phosphor is limited to 20% by weight or less because more than 20% by weight of auxiliary phosphor may cause excessive changes to the emission spectrum of the LuYAG and KSF phosphors.

Although the amount of the phosphor in the wavelength conversion member of the invention varies with the thickness of the wavelength conversion member, the desired state of color reproduction, and other factors, the total amount of LuYAG phosphor as component (A), KSF phosphor as component (B), and auxiliary phosphor is preferably in a range of at least 0.5% by weight, more preferably at least 3% by weight, even more preferably at least 5% by weight, and most preferably at least 7% by weight, and up to 30% by weight, more preferably up to 15% by weight, even more preferably up to 12% by weight.

The thickness of the wavelength conversion member is generally 1 to 5 mm. While the content of the phosphor in the wavelength conversion member must be determined in consideration of many factors, for example, the content is preferably up to 12% by weight, more preferably up to 10% by weight when the wavelength conversion member has a thickness of 2 mm. When the wavelength conversion member has a thickness of 2 mm, the phosphor content is preferably at least 5% by weight for the reason that if the phosphor content is less than 5% by weight, the amount of emission from the phosphor may be so small as to make it difficult to obtain emission of practically acceptable color temperature.

On the other hand, if the phosphor is contained in a higher content, a more amount of light may be emitted, but uniform mixing of the phosphor in the thermoplastic resin is difficult. For this reason from the manufacture aspect, the phosphor content is preferably up to 30% by weight. If the phosphor content exceeds 30% by weight, there is a possibility that the friction of phosphor particles with the mixing screw of the molding machine and the abrasion of the machine during mixing operation increase, and the abrasion of the molding machine causes contamination, with which the wavelength conversion member is discolored. Also an excessively high phosphor content leads to a high probability of failure that phosphor particles locally agglomerate in the wavelength conversion member, whereby the emission distribution over the wavelength conversion member becomes non-uniform, and the wavelength conversion member loses its mechanical strength.

The color temperature of emission of the wavelength conversion member lowers as the phosphor content increases, whereas the color temperature elevates as the phosphor content decreases. The phosphor content must be determined by taking into account not only the desired color of emission, but also the emissive ability and particle size distribution of the phosphor, the thickness of the wavelength conversion member as molded, and the structure of the light source in the light-emitting device. In turn, the thickness and shape of the wavelength conversion member are determined as appropriate depending on the phosphor content and the desired emission wavelength.

Like the prior art wavelength conversion member using thermoplastic resin, the wavelength conversion member of the invention may contain a stabilizer such as photostabilizer or UV absorber, molding lubricant and other agents as additives or adjuvants in an amount of 0.1 to 0.3% by weight. Particularly when resins exhibiting a high viscosity in the molten state such as acrylic resin and polycarbonate are used, it is preferred to add a lubricant as the additive because the dispersion of the phosphor mixed in the resin is improved. When metal ion-sensitive resins such as polypropylene are used, a heavy metal inactivating agent may be added as the additive in an estimated amount of 0.3% by weight at most, for the purpose of preventing a drop of strength during long-term service. Also, an antioxidant, radical reaction inhibitor or the like may be added as the additive for improving the durability of thermoplastic resin.

Additionally, a photo-diffusing agent may be mixed when the content (mixing concentration) of phosphor is low, or for the purpose of increasing haze to improve the diffusion of light transmitted by the wavelength conversion member. Examples of the photo-diffusing agent include ultrafine particles of a resin having a different refractive index from the thermoplastic resin, and powdered inorganic ceramics such as talc, aluminum oxide, silicon oxide, aluminum silicate, and yttrium oxide. Of these, preferred are powdered aluminum oxide and powdered silicon oxide having a high transparency and a low loss of transmitted light. The photo-diffusing agent preferably has a particle size D50 of from 0.1 µm to 20 µm. If the D50 value is less than 0.1 µm or more than 20 µm, then the effect of the photo-diffusing agent may lower. The content of the photo-diffusing agent in the wavelength conversion member is preferably at least 0.05% by weight, more preferably at least 0.1% by weight, and up to 5% by weight, more preferably up to 1.5% by weight, even more preferably up to 0.5% by weight. If the content of the photo-diffusing agent is less than 0.05% by weight, the photo-diffusing effect may be insufficient. A content in excess of 5% by weight may reduce the light transmittance of the wavelength conversion member.

The wavelength conversion member may be prepared by mixing the thermoplastic resin, the phosphors, and optionally additives and photo-diffusing agent, and molding the resin to the predetermined thickness and shape. Specifically, the wavelength conversion member may be obtained by mixing the LuYAG phosphor as component (A), the KSF phosphor as component (B), optional auxiliary phosphor, additive, and photo-diffusing agent in the thermoplastic resin on a mixer, and then molding the mixture to any appropriate shape for a particular application. As to the molding step, for example, the molten mixture as taken out of the mixer may be directly molded to the predetermined thickness and shape. Alternatively, the mixture is once processed into pellets before the pellets are molded into a wavelength conversion member of the predetermined thickness and shape.

While the molding technique is not particularly limited, any prior art well-known molding techniques used for molding of thermoplastic resins may be applied. Among others, injection molding is the preferred technique for molding the thermoplastic resin according to the invention because of a possibility of melting, molding and solidifying within a short time.

The wavelength conversion member thus molded is a molded resin body having the phosphors, additives and photo-diffusing agent uniformly dispersed in the thermoplastic resin. In particular, the wavelength conversion member of the invention has the interior structure that discrete phosphor particles are surrounded by the thermoplastic resin. The wavelength conversion member of this structure is advantageous with respect to the moisture resistance and chemical stability of phosphor. The use of the wavelength conversion member of the invention ensures that satisfactory color development is achieved by accurately controlling the transmission of blue light from the LED light source and the emissions of yellow green, yellow and red colors from phosphor particles.

Next, the light-emitting device of the invention is described.

The light-emitting device of the invention comprises a blue LED light source capable of emitting light containing a blue light component having a peak wavelength of 440 to 470 nm and a wavelength conversion member disposed on the optical axis of the blue LED light source. The blue LED light source may be either a blue LED or a pseudo-white LED using blue LED, i.e., pseudo-white LED capable of emitting light containing a blue component.

Figure 4:
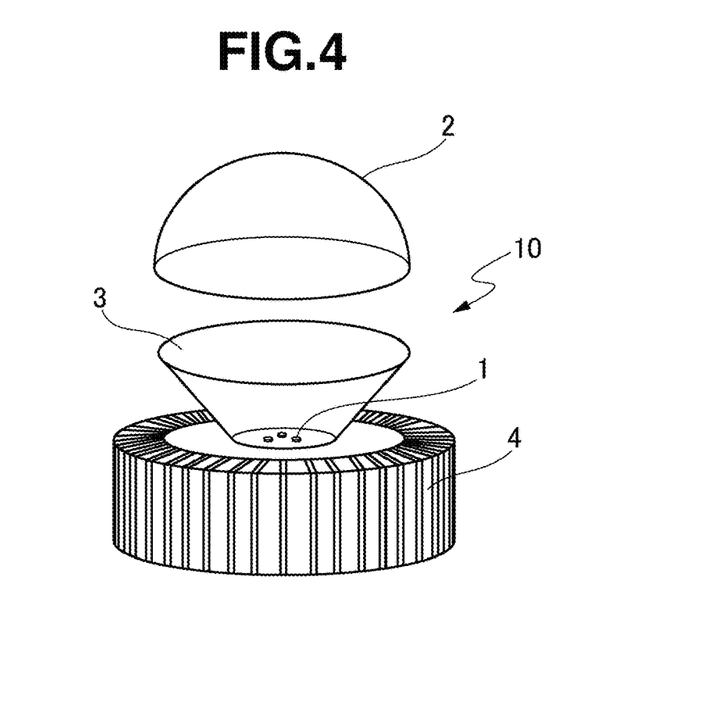
FIG. 4 is an exploded perspective view of one exemplary light-emitting device of the invention.

FIG. 4 is an exploded perspective view of one exemplary light-emitting device of the invention. The light-emitting device 10 includes an LED light source (LED chip) 1 capable of emitting blue light, and a wavelength conversion member 2 of semispherical dome shape disposed forward in emission direction of the LED light source 1. Also illustrated in FIG. 4 are a reflector 3 and radiating fins 4.

The emission of the LED light source must contain a light component capable of exciting the phosphor in the wavelength conversion member. Thus the LED light source capable of emitting blue light, for example, blue light having a peak wavelength of 440 to 470 nm, or light containing the blue light component is preferable. Also, the LED light source 1 comprising a plurality of LED chips is preferable as the illuminating LED from the standpoints of emission efficiency and luminous flux distribution.

The wavelength conversion member should be so shaped as to ensure entry of light from the LED light source thereto and efficient emergence of light therefrom as the light-emitting device. This member is preferably a self-supporting member independent of the LED light source. Its shape is not limited to the semispherical dome shape shown in FIG. 4, and may be any of curvilinear shape (like incandescent lamps), arch shape or simple disc shape.

The wavelength conversion member should preferably have an integrating sphere light transmittance of from 20% to 90%, more preferably from 30% to 70% with respect to blue light of wavelength 440 to 490 nm, especially 440 to 470 nm. If the transmittance of excitation light is less than 20%, the emission of the light-emitting device may be short of blue light, with a balance of colors being degraded. If the transmittance exceeds 90%, yellow light and red light may become short, leading to an insufficient improvement in color rendering.

The spacing between the LED light source and the wavelength conversion member is preferably at least 5 mm. The light-emitting device of the structure that the LED light source and the wavelength conversion member are disposed at an extremely short spacing or in contact has the risk that the wavelength conversion member is readily deformed or degraded by the heat from the LED light source. The spacing between the LED light source and the wavelength conversion member may be set to an appropriate distance depending on the heat release from the LED light source. The upper limit of the spacing between the LED light source and the wavelength conversion member is typically up to 5 cm, but not critical.

The chromaticity of light emitted by the LED light-emitting device may be adjusted depending on the wavelength of emitted light, the shape and thickness of the wavelength conversion member, the content of phosphor, the location of the wavelength conversion member relative to the optical axis of the LED light source, and the like. The content of phosphor in the wavelength conversion member is determined in consideration of the quantity of incident blue light, the quantity of emergent light in yellow wavelength region, the transmittance of blue light, and the like. For example, when it is desired to discharge light having a color temperature of around 5000K (e.g., 4500 to 5500K) from the wavelength conversion member of 2 mm thick, the content of phosphor preferably ranges from 2% by weight, especially from 3% by weight to 4% by weight of LuYAG phosphor and from 5% by weight, especially from 6% by weight to 8% by weight, especially to 7% by weight of KSF phosphor.

Figure 5A:
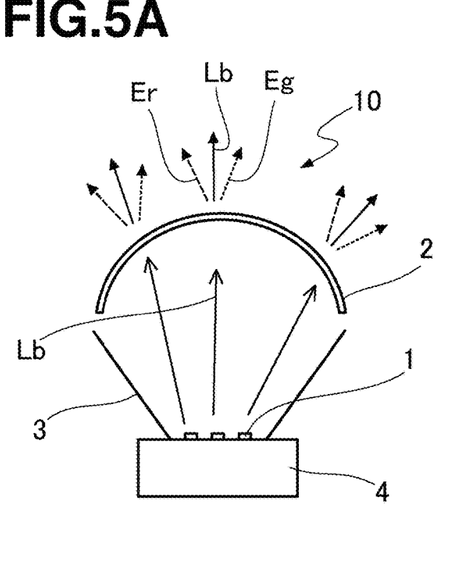
Figure 5B:
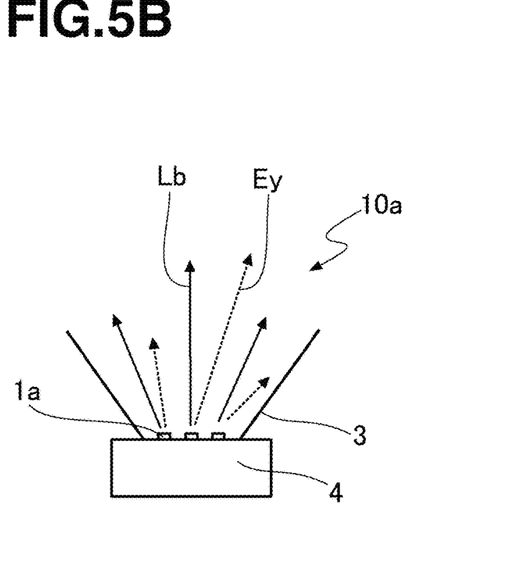

The light-emitting device of the invention is preferably of the remote phosphor type wherein the LED chip and the wavelength conversion member are spaced apart via a vacuum layer or a gas layer such as air layer. FIG. 5 schematically illustrates the emission modes of LED light-emitting devices, FIG. 5(A) being the emission mode of a light-emitting device of remote phosphor type, and FIG. 5(B) being the emission mode of a prior art light-emitting device of multiple white LED type. In the light-emitting device 10 of remote phosphor type as shown in FIG. 5(A), part of blue light Lb entering the wavelength conversion member 2 from the LED light source 1 is absorbed by the phosphor, and there emerges a light mixture of the remainder of blue light Lb and yellow green light Eg and red light Er included in the emissions generated by the phosphors in proportion to the phosphor contents. Inversely in the prior art light-emitting device 10a of multiple white LED type as shown in FIG. 5(B), each of discrete white LEDs 1a produces a mixture of blue light Lb and yellow light Ey due to the fluorescence of the phosphor. As a result, the prior art light-emitting device of multiple white LED type is difficult to select the emission spectrum and output of discrete white LEDs (pseudo-white LEDs) in uniformity, tending to incur a variation among devices. In the device of remote phosphor type wherein the wavelength conversion member is responsible to toning of light, uniform light of stable chromaticity is obtained even when a multiplicity of LED chips are used as the light source. Illustrated in FIG. 5 are a reflector 3 and a radiating fin 4.

Also, in the light-emitting device of remote phosphor type, since a wavelength conversion member having optimized emission color is assembled at the final stage of assembly of the light-emitting device, the desired emission color is readily obtained and the emission characteristics are highly stable. In the light-emitting device wherein the LED light source (LED chip) serving as a heat source and the wavelength conversion member are spatially independent, the heating of the wavelength conversion member is mitigated. As a result, a high emission efficiency is obtained and the light-emitting device has a long lifetime.

Since the wavelength conversion member is disposed forward in emission direction of the LED light source such as blue LED, white light of improved color reproduction is obtainable from a combination of red light of wavelength 600 to 660 nm affecting color rendering, blue light of wavelength 440 to 470 nm, and yellow green light of main wavelength 563 to 570 nm due to LuYAG, specifically white light having such a color that in the chromaticity coordinates in the xy chromaticity diagram (CIE 1931), x is at least 0.3100, especially at least 0.3106 and up to 0.3850, especially up to 0.3820, and y is at least 0.3190, especially at least 0.3199 and up to 0.3790, especially up to 0.3786 is obtainable. Thus light having satisfactory color rendering even in the region of color temperature 5000K is obtainable.

EXAMPLES

Examples and Comparative Examples are given below for illustrating the invention, but the invention is not limited thereto.

Examples 1 to 6

To pellets of transparent acrylic resin Delpet (Asahi Kasei Corp.) was added 0.15 wt % of Licowax E (Clariant) as additive. The pellets were stirred, heat treated at 90° C. for 11 hours, and dried, forming a wax layer on the surface of pellets. Using a twin-screw extruder (Toshiba Machine Co., Ltd.), KSF phosphor of $K_2(Si_{0.98}Mn_{0.02})F_6$ having a particle size D50 of ~15 μm and LuYAG phosphor of $(Y_{0.294}Lu_{0.686}Ce_{0.02})_3Al_5O_{12}$ having a particle size D50 of ~12 μm and an outer appearance color having a lightness L* value of 106.30, an a* value of −22.28 and a b* value of 93.25 in the chromaticity coordinates of the CIE L*a*b* colorimetric system were mixed in 8 kg of the additive-coated acrylic resin pellets in the amounts shown in Table 1 at 230° C., yielding acrylic resin pellets having the phosphors incorporated therein.

The LuYAG phosphor used herein had an X-ray diffraction profile (analyzed by X-ray diffraction system D8 Advance (Bruker AXS)) as shown in FIG. 1. Also, the LuYAG phosphor had an intensity of emission (fluorescence) of wavelength 550 nm upon excitation with light of wavelength 420 to 490 nm and an emission (fluorescence) spectrum upon excitation with blue light of wavelength 450 nm (both analyzed by spectrophotometer FP-6500 (JASCO Corp.)) as shown in FIGS. 2 and 3, respectively.

Next, using an injection molding machine EC130SX (Toshiba Machine Co., Ltd.), the acrylic resin pellets having the phosphors incorporated therein were molded at 250° C. into a plate of 150 mm squares and 2 mm thick. The resin plate was then machined into a disc of diameter 60 mm, which served as a wavelength conversion member. A remote phosphor type light-emitting device with a rated power of 11.5 W was fabricated from LED module LMH2 (Cree) by replacing its light source LED chips by twelve blue LED chips with peak wavelength 453 nm and its flat lens by the above wavelength conversion member.

Figure 6:
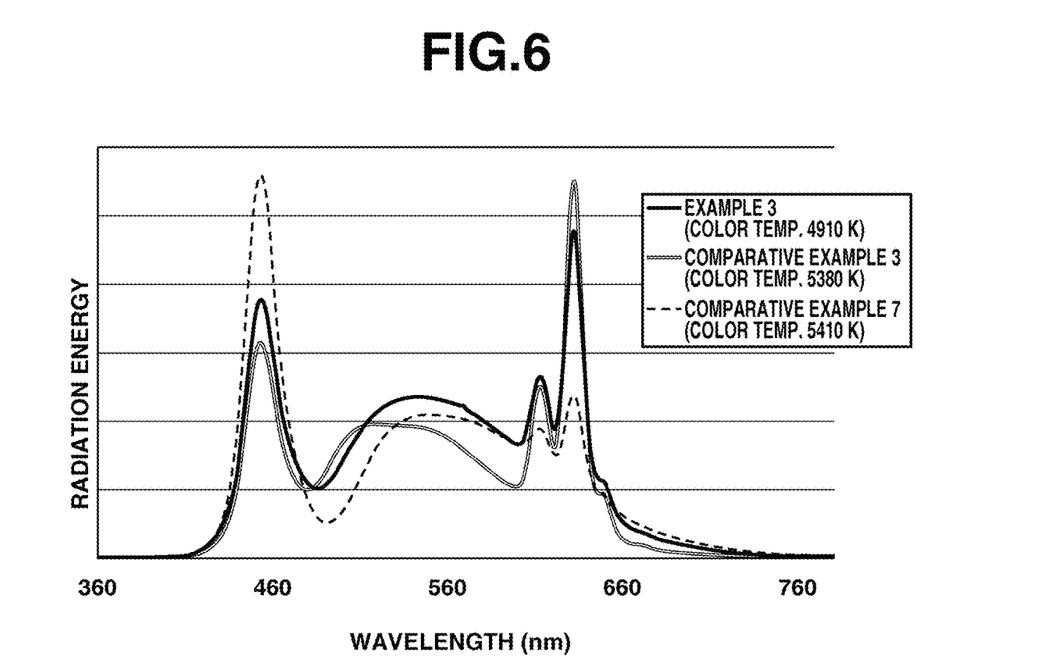
FIG. 6 is a diagram showing the emission spectra of light-emitting devices of Example 3, Comparative Example 3 and Comparative Example 7.
Figure 7:
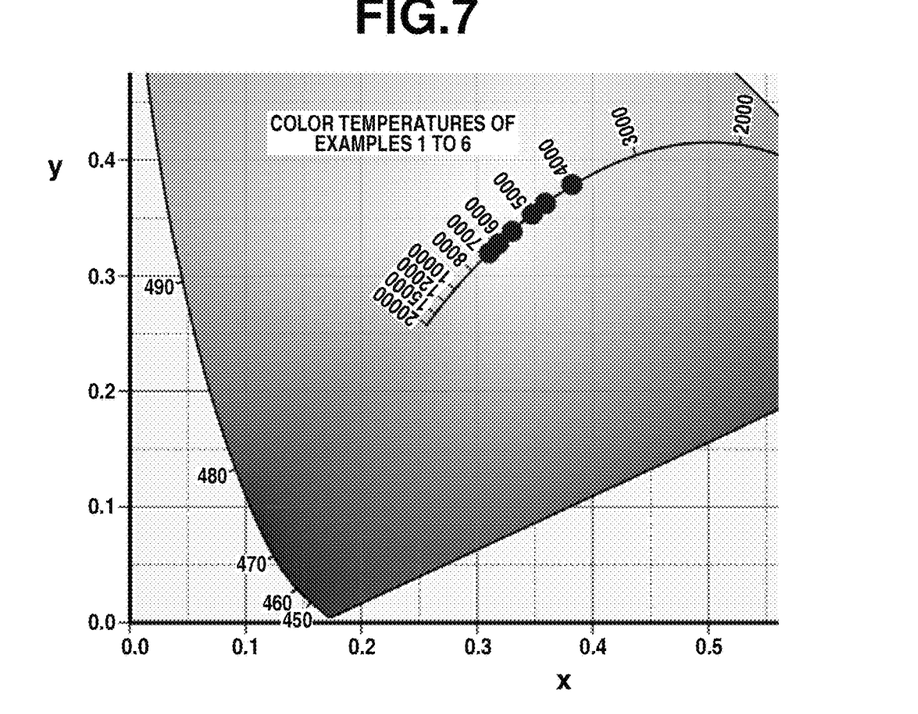
FIG. 7 is a diagram showing coordinates on xy chromaticity space of the emissions of light-emitting devices of Examples 1 to 6.

Using an illuminance spectrophotometer CL-500A (Konica-Minolta Optics Co., Ltd.), this light-emitting device was measured for chromaticity of its emission for evaluating color temperature, color rendering, and color deviation. Emissive characteristics of the light-emitting device are shown in Table 1. FIG. 6 shows the emissive spectrum of the light-emitting device in Example 3, and FIG. 7 shows coordinates on the xy chromaticity diagram of Examples 1 to 6.

TABLE 1

|  | Phosphor (wt %) | | Color temp. | Color deviation | Color rendering | | Chromaticity | |
| --- | --- | --- | --- | --- | --- | --- | --- | --- |
|  | LuYAG | KSF | (K) | duv | Ra | R9 | x | y |
| Example 1 | 2.22 | 8.73 | 4,000 | 0.0004 | 94 | 80 | 0.3820 | 0.3786 |
| Example 2 | 2.39 | 7.52 | 4,550 | 0.0001 | 95 | 91 | 0.3592 | 0.3627 |
| Example 3 | 2.49 | 6.85 | 4,910 | −0.0001 | 95 | 98 | 0.3476 | 0.3534 |
| Example 4 | 2.63 | 5.80 | 5,590 | −0.0004 | 94 | 92 | 0.3304 | 0.3386 |
| Example 5 | 2.74 | 5.00 | 6,200 | −0.0002 | 92 | 83 | 0.3184 | 0.3279 |
| Example 6 | 2.80 | 4.48 | 6,700 | −0.0005 | 91 | 78 | 0.3106 | 0.3199 |

Comparative Examples 1 to 7

A wavelength conversion member was prepared as in Examples except that the KSF phosphor and a cerium-activated lutetium-aluminum garnet phosphor (LuAG phosphor) represented by $Lu_3Al_5O_{12}:Ce^{3+}$ (Ce activation 2 mol %) or a cerium-activated yttrium-aluminum garnet phosphor (YAG phosphor) represented by $Y_3Al_5O_{12}:Ce^{3+}$ (Ce activation 2 mol %) instead of the LuYAG phosphor were used as the phosphor in the contents shown in Table 2; and a remote phosphor type light-emitting device was fabricated using the resulting wavelength conversion member.

The LuAG phosphor and YAG phosphor used herein had an X-ray diffraction profile (analyzed by X-ray diffraction system D8 Advance (Bruker AXS)) as shown in FIG. 1. Also, the LuAG phosphor and YAG phosphor had an intensity of emission (fluorescence) of wavelength 550 nm upon excitation with light of wavelength 420 to 490 nm and an emission (fluorescence) spectrum upon excitation with blue light of wavelength 450 nm (both analyzed by spectrophotometer FP-6500 (JASCO Corp.)) as shown in FIGS. 2 and 3, respectively.

Using an illuminance spectrophotometer CL-500A (Konica-Minolta Optics Co., Ltd.), this light-emitting device was measured for chromaticity of its emission for evaluating color temperature, color rendering, and color deviation. Emissive characteristics of the light-emitting device are shown in Table 2. FIG. 6 shows the emissive spectra of the light-emitting devices in Comparative Example 3 and 7.

Figure 8:
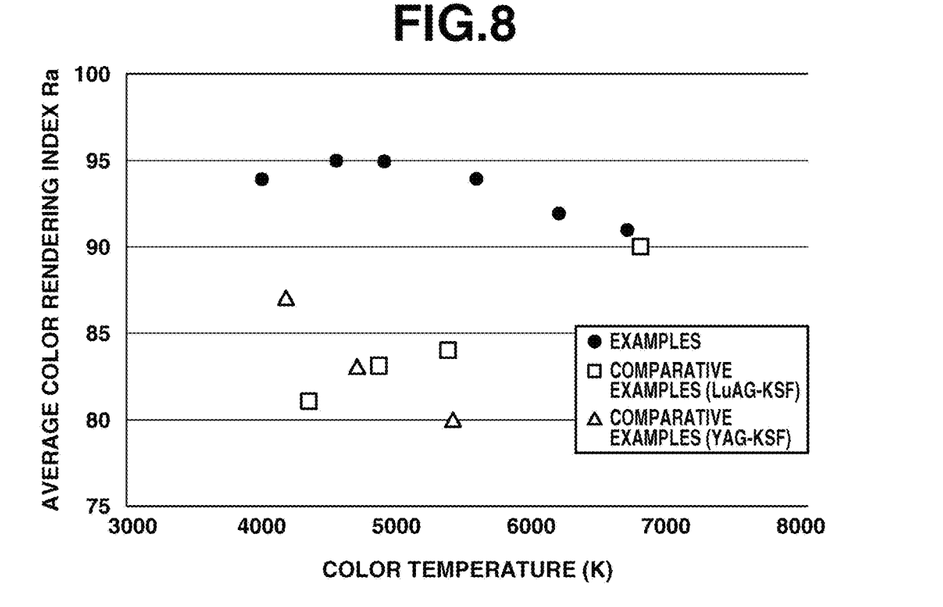
FIG. 8 is a diagram showing the color temperature vs. average color rendering index Ra of emissions of light-emitting devices of Examples 1 to 6 and Comparative Examples 1 to 7.
Figure 9:
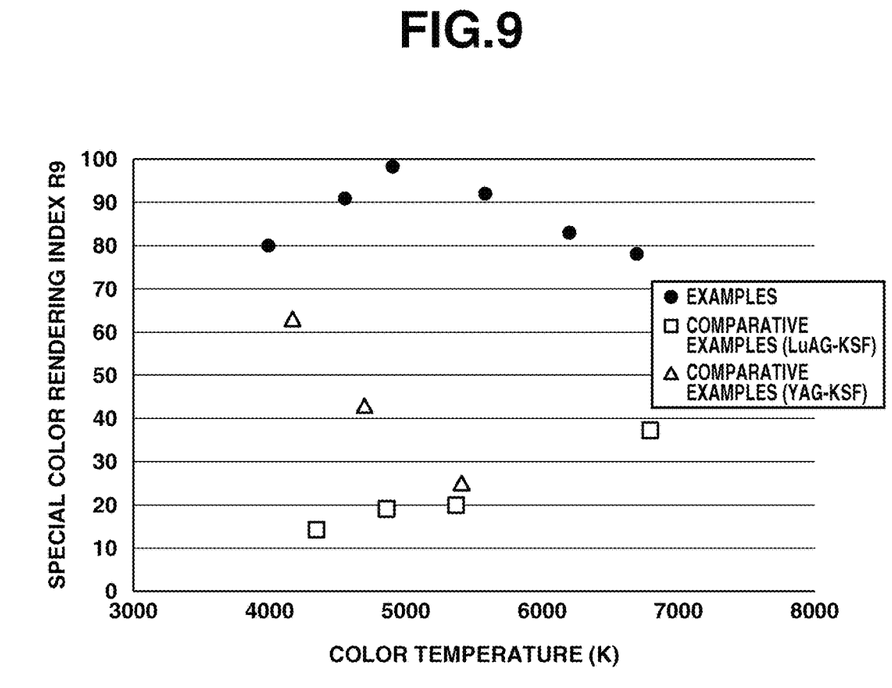
FIG. 9 is a diagram showing the color temperature vs. special color rendering index R9 of emissions of light-emitting devices of Examples 1 to 6 and Comparative Examples 1 to 7.

The relationship of color temperature to average color rendering index Ra or special color rendering index R9 of the light-emitting devices in Examples 1 to 6 and Comparative Example 1 to 7 is shown in FIG. 8 or 9. It is evident that the wavelength conversion members and remote phosphor type light-emitting devices in Example 1 to 6 produce light with improved color rendering at an approximate level of duv over the wavelength conversion members and remote phosphor type light-emitting devices using LuAG-KSF phosphor mixture or YAG-KSF phosphor mixture.

Using the wavelength conversion member and light-emitting device within the scope of the invention, light having minimized duv and greater values of Ra and R9 than prior art LED light-emitting devices, in the color temperature region of 4000 to 6700K is obtainable. That is, the invention affords light emission having not only high contrast and color reproduction, but also improved reproduction of red color and high color rendering leading to a vivid perception.

REFERENCE SIGNS LIST

1 LED light source (LED chip)
1a white LED
2 wavelength conversion member
3 reflector
4 radiating fin
10, 10a light-emitting device
Lb blue light
Eg yellow green light
Er red light
Ey yellow light

TABLE 2

|  | Phosphor (wt %) | | | Color temp. | Color deviation | Color rendering | | Chromaticity | |
| --- | --- | --- | --- | --- | --- | --- | --- | --- | --- |
|  | LuAG | YAG | KSF | (K) | duv | Ra | R9 | x | y |
| Comparative Example 1 | 3.24 | — | 9.55 | 4,380 | 0.0001 | 81 | 14 | 0.365 | 0.3668 |
| Comparative Example 2 | 3.27 | — | 8.88 | 4,870 | 0.0003 | 83 | 19 | 0.349 | 0.3552 |
| Comparative Example 3 | 3.23 | — | 8.13 | 5,380 | −0.0004 | 84 | 20 | 0.3353 | 0.3427 |
| Comparative Example 4 | 3.09 | — | 6.15 | 6,800 | 0.0005 | 90 | 37 | 0.2984 | 0.3091 |
| Comparative Example 5 | — | 2.29 | 7.47 | 4,170 | −0.0001 | 87 | 63 | 0.3731 | 0.3712 |
| Comparative Example 6 | — | 2.68 | 5.76 | 4,700 | 0.0004 | 83 | 43 | 0.3541 | 0.3595 |
| Comparative Example 7 | — | 3.14 | 3.82 | 5,410 | 0.0001 | 80 | 25 | 0.3346 | 0.3432 |

The invention claimed is:

1. A wavelength conversion member comprising a phosphor dispersed in a thermoplastic resin, the phosphor comprising (A) a cerium-activated lutetium-yttrium-aluminum garnet phosphor represented by the compositional formula (1):

$$(Y_{1-\alpha-\beta}Lu_\alpha Ce_\beta)_3Al_5O_{12} \quad (1)$$

wherein $\alpha$ is a positive number of from 0.3 to 0.8 and $\beta$ is a positive number of from 0.01 to 0.05, capable of emitting yellow-green light upon excitation with blue light, and having a diffraction peak within a diffraction angle $2\theta$ range of from 52.9° to 53.2° in X-ray diffraction by the $K_{\alpha 1}$ line of Cu, and (B) a manganese-activated silicon complex fluoride phosphor represented by the compositional formula (2):

$$K_2(Si_{1-x}Mn_x)F_6 \quad (2)$$

wherein x is a positive number of from 0.001 to 0.3, and capable of emitting red light upon excitation with blue light, in a weight ratio of the phosphor as component (B) to the phosphor as component (A) of from 1/1 to 5/1.

2. The wavelength conversion member of claim 1 wherein the phosphor as component (A) has an outer appearance color having an a* value of from −23.0 to −21.0 and a b* value of from 87.0 to 97 as chromaticity coordinates in the CIE L*a*b* colorimetric system.

3. The wavelength conversion member of claim 1 wherein the thermoplastic resin comprises at least one resin selected from the group consisting of a polyolefin, polystyrene, styrene copolymer, fluoro-resin, acrylic resin, nylon, polyester, polyethylene terephthalate, polycarbonate, vinyl chloride resin and polyether resin.

4. A light-emitting device comprising a blue LED light source capable of emitting light containing a blue light component having a peak wavelength of 440 to 470 nm and having an optical axis and a wavelength conversion member disposed on the optical axis of the blue LED light source, the wavelength conversion member being of claim 1.

5. The light-emitting device of claim 4 which emits light of color having an x value of from 0.3100 to 0.3850 and a y value of from 0.3190 to 0.3790 as chromaticity coordinates in the xy chromaticity diagram (CIE 1931).

6. The light-emitting device of claim 4 which is of remote phosphor type.

* * * * *